United States Patent [19]

Susak

[11] Patent Number: 4,736,126

[45] Date of Patent: Apr. 5, 1988

[54] TRIMMABLE CURRENT SOURCE

[75] Inventor: David M. Susak, Mesa, Ariz.

[73] Assignee: Motorola Inc., Schaumburg, Ill.

[21] Appl. No.: 946,349

[22] Filed: Dec. 24, 1986

[51] Int. Cl.⁴ ...................... H03K 17/687; H03K 3/26

[52] U.S. Cl. ................................... 307/571; 307/310; 307/580; 323/907

[58] Field of Search ...................... 307/310, 580, 571; 323/907, 313

[56] References Cited

U.S. PATENT DOCUMENTS

| | | | |
|---|---|---|---|
| 3,638,049 | 1/1972 | Bom | 307/310 |
| 3,700,934 | 10/1972 | Swain | 307/310 |
| 4,283,641 | 8/1981 | Skingley | 307/310 |
| 4,347,476 | 8/1982 | Tam | 323/313 |
| 4,453,121 | 6/1984 | Noufer | 323/313 |

OTHER PUBLICATIONS

IEEE Journal of Solid-State Circuits, vol. SC14, No. 6, "Temperature Compensated Quad Analog Switch", Adib R. Hamade, Dec. 1979, pp. 944–952.

*Primary Examiner*—Stanley D. Miller
*Assistant Examiner*—B. P. Davis
*Attorney, Agent, or Firm*—Dale E. Jepsen

[57] ABSTRACT

A JFET circuit generates an adjustable current having a temperature coefficient proportional to $I_{DSS}$ where $I_{DSS}$ is the drain current of a JFET when its source and gate are shorted. The JFET has a source terminal coupled to a source of supply voltage. An adjustable resistor is coupled between the gate and source terminals of the JFET. A reference current is supplied to the resistor, which reference current is proportional to the JFET's pinch-off voltage. The desired current appears at the drain of the JFET.

2 Claims, 1 Drawing Sheet

TRIMMABLE CURRENT SOURCE

BACKGROUND OF THE INVENTION

This invention relates generally to current source circuitry, and more particularly to a junction field effect transistor (JFET) circuit for generating a current ($I_D$) which is proportional to the saturation current ($I_{DSS}$) of the JFET and tracks $I_{DSS}$ over temperature.

In an operational amplifier which utilizes JFET followers for driving a PNP differential stage, it is desirable that the JFETs be supplied each with a current equal to $I_{DSS}$ (the drain current when the gate and source are shorted), and in this manner provide a gate to source voltage ($V_{gs}$) equal to zero and a temperature coefficient equal to zero (i.e. dVgs/dT=0). Furthermore, with $V_{gs}$ on both sides of the amplifier (i.e. $V_{gs1}$ $V_{gs2}$) equal to zero, the offset voltage $V_{os}$ which equals $V_{gs1}-V_{gs2}$ would be equal to zero as would dVos/dT. Unfortunately, in the past the required current equal to $I_{DSS}$ of the JFET followers could not be assured sufficiency to achieve consistently acceptable results.

SUMMARY OF THE INVENTION

It is an object of the present invention to provide an improved circuit for generating a current which is proportional to $I_{DSS}$.

It is a further object of the present invention to provide a circuit which generates a current which is proportional to $I_{DSS}$ and which $I_{DSS}$ over temperature.

According to a broad aspect of the invention there is provided a circuit for generating an adjustable current having a temperature coefficient proportional to that of $I_{DSS}$ where $I_{DSS}$ is a drain current of a JFET when its source and gate terminals are shorted, comprising a first JFET having a source terminal coupled to a source of supply voltage, a drain terminal for conducting said current, and having a gate terminal. An adjustable resistor is coupled between the gate terminal and the source terminal, and a current source is coupled to the resistor to causing a current to flow through the resistor so as to develop a voltage across the gate and source terminals.

The above and other objects, features, and advantages of the present invention will be more clearly understood from the following detailed description taken in conjunction with the accompanying drawings, in which:

DESCRIPTION OF THE PREFERRED EMBODIMENT

Figure 1:
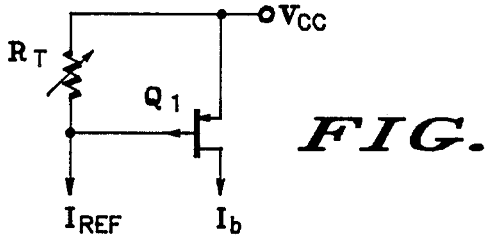
FIG. 1 is a schematic diagram of the inventive current generating circuit.

Referring to FIG. 1, the inventive current source comprises a JFET Q1 having a source coupled to a source of supply voltage $V_{CC}$ and having a drain at which the required current $I_D$ is made available. The gate of $Q_1$ is coupled via a trimmable resistor $R_T$ to the source of supply $V_{CC}$. The gate is also coupled to the source of a reference current $I_{REF}$.

Figure 2:
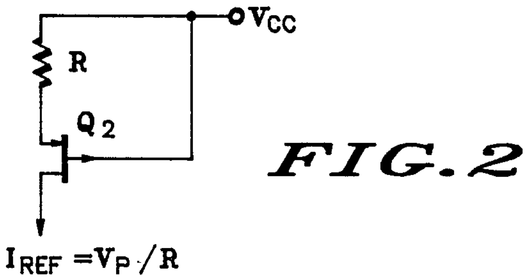
FIG. 2 is a schematic diagram of a circuit for generating the reference current utilized in FIG. 1

The reference current $I_{REF}$ may be generated, for example, by the circuit shown in FIG. 2. As can be seen, a second JFET $Q_2$ has a source coupled, via resistor R, to a source of supply voltage $V_{CC}$. The gate of $Q_2$ is also coupled to $V_{CC}$. The reference current $I_{REF}$ appears at the drain of $Q_2$ and is equal to $V_P/R$ where $V_P$ is the pinch-off voltage of $Q_2$. Alternatively, the required reference current $I_{REF}$ could be generated in the manner described in copending patent application Ser. No. SC05987 entitled "CIRCUIT FOR GENERATING A REFERENCE CURRENT PROPORTIONAL TO THE PINCH-OFF VOLTAGE OF A JFET" and assigned to the assignee of the present invention.

Referring again to FIG. 1, $I_D$ may be expressed as $$I_D = I_{DSS}(1 - V_{gs}/V_p)^2 \quad (1)$$

where $V_{gs}$ is the gate to source voltage of $Q_1$ and $V_p$ is the pinch-off voltage of $Q_1$. Since the source of $Q_1$ is biased above its gate, $V_{gs}$ may be expressed as $$V_{gs} = -I_{REF}R_T \quad (2)$$

Substituting Equation (2) into equation (1) yields $$I_D = I_{DSS}(1 + I_{REF}R_T/V_p)^2 \quad (3)$$

As previously described, $I_{REF}$ equals $V_p/R$. Therefore, $$I_D = I_{DSS}(1 + V_pR_T/V_pR)^2 \quad (4)$$

As long as JFETs $Q_1$ and $Q_2$ are in close proximity, their pinch-off voltages will be substantially equal and Equation (4) becomes $$I_D = I_{DSS}(1 + R_T/R)^2 \quad (5)$$

Thus, it can be seen that $I_D$ appearing at the drain of JFET $Q_1$ is proportional to $I_{DSS}$ and may be trimmed simply by altering the ratio of $R_T/R$. This is accomplished by trimming adjustable resistor $R_T$. Through this mechanism, $I_D$ may be adjusted so as to be equal to $I_{DSS}$ of the operational ampifier's JFET follower transistor.

If we next assume that resistors R and $R_T$ are of the same type, then the temperature coefficient of R is substantially identical to that of $R_T$ that is $$dR/dT = dR_T/dT \quad (6)$$

This being the case, the temperature coefficient of $I_D$ is proportional to that $I_{DSS}$ as is shown in Equation (7).

$$dI_D/dT = (dI_{DSS}/dT)(1 + R_T/R)^2 \quad (7)$$

Thus, the circuit shown in FIG. 1 when driven by a reference current equal to $V_P/R$ produces a current $I_D$ which is proportional to $I_{DSS}$ and trimmable and one which has a temperature coefficient which is proportional to that of $I_{DSS}$.

The above description is given by way of example only. Changes in form and details may be made by one skilled in the art without departing from the scope of the invention as defined by the appended claims.

I claim:

1. A circuit for generating an adjustable current having a temperature coefficient proportional to that of $I_{DSS}$ where $I_{DSS}$ is a drain current of a JFET when its soruce and gate terminals are shorted, comprising:

a first JFET having a source terminal coupled to a source of supply voltage, a drain terminal for conducting said current, and having a gate terminal;

an adjustable resistor coupled between said gate terminal and said source terminal; and a current source coupled to said resistor for causing a current to flow through said resistor so as to develop a voltage across said gate and source terminals, wherein said current source generates a current proportional to the pinch-off voltage of said first JFET.

2. A circuit according to claim 1 wherein said current source includes at least a second JFET having a pinch-off voltage substantially equal to that of said first JFET.

* * * * *